United States Patent
Cai et al.

(10) Patent No.: US 12,004,372 B2
(45) Date of Patent: Jun. 4, 2024

(54) DISPLAY PANEL AND DISPLAY DEVICE

(71) Applicant: Hubei Yangtze Industrial Innovation Center of Advanced Display Co., LTD., Wuhan (CN)

(72) Inventors: Yu Cai, Wuhan (CN); Jiaxian Liu, Shanghai (CN)

(73) Assignee: Hubei Yangtze Industrial Innovation Center of Advanced Display Co., LTD., Wuhan (CN)

( * ) Notice: Subject to any disclaimer, the term of this patent is extended or adjusted under 35 U.S.C. 154(b) by 410 days.

(21) Appl. No.: 17/451,982

(22) Filed: Oct. 22, 2021

(65) Prior Publication Data

US 2022/0344622 A1 Oct. 27, 2022

(30) Foreign Application Priority Data

Apr. 21, 2021 (CN) .......................... 202110432579.9

(51) Int. Cl.
*H10K 59/17* (2023.01)
*H10K 50/858* (2023.01)
*H10K 59/122* (2023.01)
*H10K 59/35* (2023.01)

(52) U.S. Cl.
CPC ......... *H10K 50/858* (2023.02); *H10K 59/122* (2023.02); *H10K 59/17* (2023.02); *H10K 59/35* (2023.02)

(58) Field of Classification Search
CPC ............................ H10K 59/122; H10K 50/858
USPC .......................................................... 313/506
See application file for complete search history.

(56) References Cited

U.S. PATENT DOCUMENTS

2020/0135971 A1* 4/2020 Beak .................... H10K 59/122
2022/0302229 A1* 9/2022 Yue ...................... H10K 50/858

FOREIGN PATENT DOCUMENTS

CN 111883684 A 11/2020

* cited by examiner

*Primary Examiner* — Christopher M Raabe
(74) *Attorney, Agent, or Firm* — Anova Law Group, PLLC

(57) ABSTRACT

The present disclosure provides a display panel, including: a substrate; a pixel definition layer disposed on a side of the substrate, that the pixel definition layer includes an isolation structure and a pixel opening enclosed by the isolation structure; and a first lens layer disposed on a side of the pixel definition layer away from the substrate, that the first lens layer includes a first lens body and a lens opening enclosed by the first lens body, and in a thickness direction of the display panel, the first lens body at least overlaps the isolation structure, and the lens opening overlaps the pixel opening, that, an orthographic projection of the first lens body on the substrate is a lens projection, an orthographic projection of the pixel opening on the substrate is a pixel projection, and a distance between at least a portion of an edge of the lens projection and an edge of the pixel projection is substantially zero.

20 Claims, 10 Drawing Sheets

US 12,004,372 B2

DISPLAY PANEL AND DISPLAY DEVICE

CROSS-REFERENCE TO RELATED APPLICATION

This application claims the priority of Chinese Patent Application No. CN202110432579.9, filed on Apr. 21, 2021, the entire contents of all of which are incorporated herein by reference.

FIELD OF THE DISCLOSURE

The present disclosure generally relates to the field of display technologies and, in particular, relates to a display panel and a display device.

BACKGROUND

Compared with a liquid crystal display, an organic light-emitting display has many advantages such as lighter and thinner, high brightness, low power consumption, fast response, high definition, good flexibility, high luminous efficiency, etc., and has gradually become a mainstream display technology. A light-emitting principle of the organic light-emitting display is that holes generated by an anode and electrons generated by a cathode in an organic light-emitting device move under an action of an electric field, respectively inject into a hole transport layer and an electron transport layer, and migrate to an organic light-emitting material layer; and when the holes and the electrons meet in the light-emitting material layer, energy excitons are generated, thereby exciting light-emitting molecules in the organic light-emitting material layer to generate visible light. However, existing display panels generally have a problem of low luminous efficiency.

BRIEF SUMMARY OF THE DISCLOSURE

One aspect of the present disclosure provides a display panel, including: a substrate; a pixel definition layer disposed on a side of the substrate, that the pixel definition layer includes an isolation structure and a pixel opening enclosed by the isolation structure; and a first lens layer disposed on a side of the pixel definition layer away from the substrate, that the first lens layer includes a first lens body and a lens opening enclosed by the first lens body, and in a thickness direction of the display panel, the first lens body at least overlaps the isolation structure, and the lens opening overlaps the pixel opening, that, an orthographic projection of the first lens body on the substrate is a lens projection, an orthographic projection of the pixel opening on the substrate is a pixel projection, and a distance between at least a portion of an edge of the lens projection and an edge of the pixel projection is substantially zero.

Another aspect of the present disclosure provides a display device, including: a display panel, including: a substrate; a pixel definition layer disposed on a side of the substrate, that the pixel definition layer includes an isolation structure and a pixel opening enclosed by the isolation structure; and a first lens layer disposed on a side of the pixel definition layer away from the substrate, that the first lens layer includes a first lens body and a lens opening enclosed by the first lens body, and in a thickness direction of the display panel, the first lens body at least overlaps the isolation structure, and the lens opening overlaps the pixel opening, that, an orthographic projection of the first lens body on the substrate is a lens projection, an orthographic projection of the pixel opening on the substrate is a pixel projection, and a distance between at least a portion of an edge of the lens projection and an edge of the pixel projection is substantially zero.

Other aspects of the present disclosure can be understood by those skilled in the art in light of the description, the claims, and the drawings of the present disclosure.

BRIEF DESCRIPTION OF THE DRAWINGS

To more clearly illustrate the technical solutions of the present disclosure, the accompanying drawings used in the description of the disclosed embodiments are briefly described hereinafter. The following drawings are merely examples for illustrative purposes according to various disclosed embodiments and are not intended to limit the scope of the present disclosure. Other drawings may be derived from such drawings by a person with ordinary skill in the art without creative efforts.

DETAILED DESCRIPTION

Figure 1:
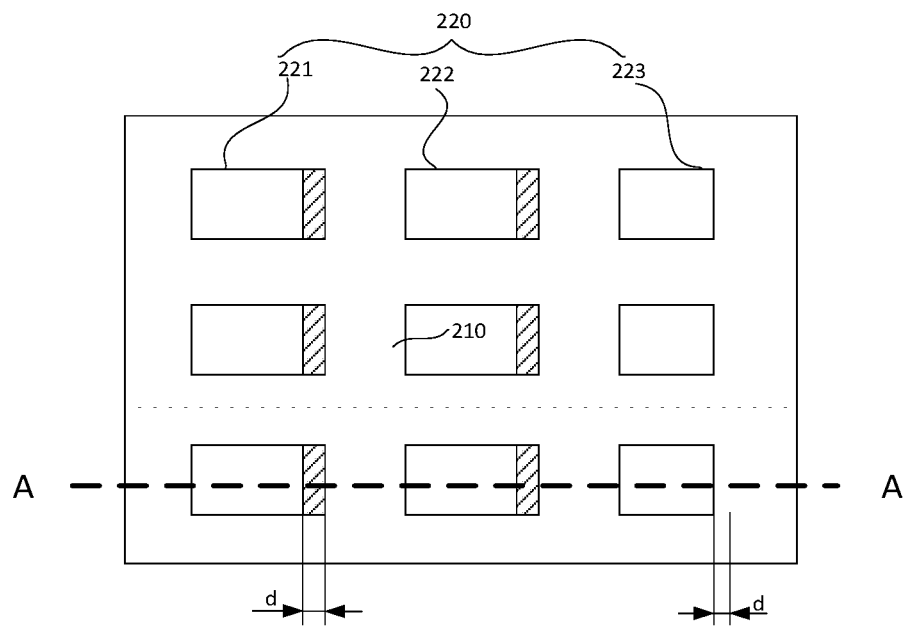
FIG. 1 is a schematic top view of a structure of an exemplary display panel according to various embodiments of the present disclosure.

Features and exemplary embodiments of various aspects of the present disclosure will be described in detail below. In the following detailed description, many alternative details are proposed to provide a comprehensive understanding of the present disclosure. However, it is obvious to those skilled in the art that the present disclosure can be implemented without some of these alternative details. The following description of the embodiments is only to provide a better understanding of the present disclosure by showing examples of the present disclosure. In the drawings and the following description, at least a portion of well-known structures and technologies are not shown to avoid unnecessary blurring of the present disclosure. For clarity, sizes of some structures may be exaggerated. In addition, features, structures, or characteristics described below may be combined in one or more embodiments in any suitable manner.

In the description of the present disclosure, it should be noted that, unless otherwise specified, "plurality" means two or more; and orientations or positional relationships indicated by terms such as "upper", "lower", "left", "right", "within", "outside", etc., are only for convenience of describing the present disclosure and simplifying the description, rather than indicating or implying that a device or element referred to must have a specific orientation, and be constructed and operated in a specific orientation, therefore cannot be understood as limitations to the present disclosure. In addition, terms such as "first", "second", etc., are only used for descriptive purposes, and cannot be understood as indicating or implying relative importance.

Orientation words appearing in the following description are all directions shown in the drawings, and are not limiting specific structures of the embodiments of the present disclosure. In the description of the present disclosure, it should also be noted that, unless otherwise clearly specified and limited, terms such as "installation" and "connection" should be understood in a broad sense, for example, it can be a fixed connection or a detachable connection, or an integral connection; and it can be directly connected or indirectly connected. For those of ordinary skill in the art, specific meaning of the above-mentioned terms in the present disclosure can be understood according to specific conditions.

To better understand the present disclosure, a display panel and a display device according to the embodiments of the present disclosure are described in detail below with reference to FIGS. 1 to 18.

Figure 2:
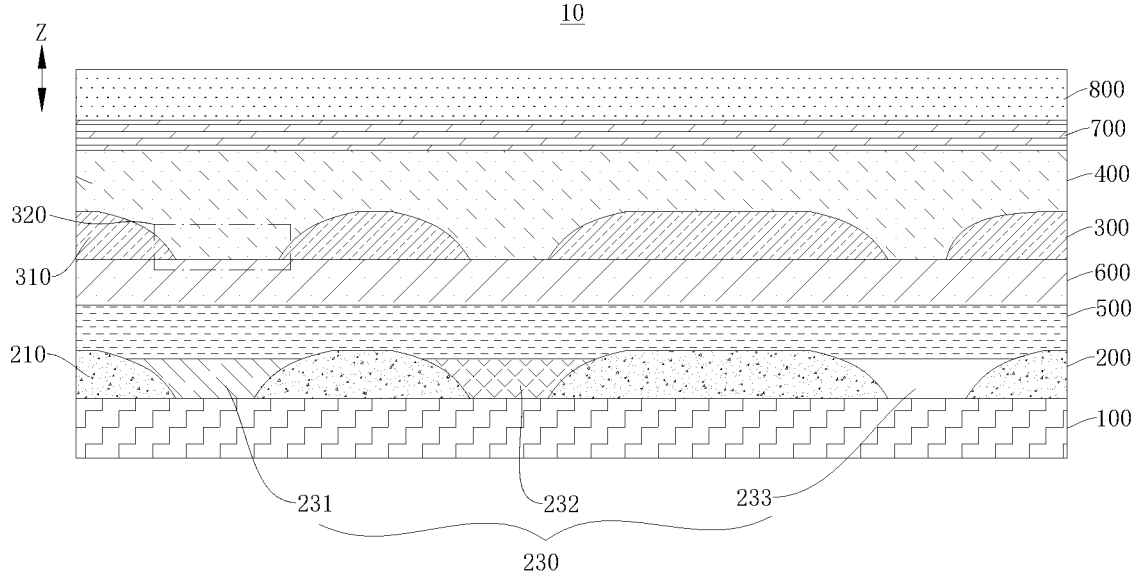
FIG. 2 is a cross-sectional view at A-A in FIG. 1.

FIG. 1 is a top view of an exemplary display panel according to various embodiments of the present disclosure. FIG. 2 is a partial cross-sectional view at A-A in FIG. 1.

Referring to FIG. 1 and FIG. 2 together, a display panel 10 is provided according to the embodiments of the present disclosure. The display panel 10 includes: a pixel definition layer 200 disposed on a side of a substrate 100, that the pixel definition layer 200 includes an isolation structure 210 and a pixel opening 220 enclosed by the isolation structure 210; and a first lens layer 300 disposed on a side of the pixel definition layer 200 away from the substrate 100, that the first lens layer 300 includes a first lens body 310 and a lens opening 320 enclosed by the first lens body 310. In a direction perpendicular to the substrate 100, the first lens body 310 at least overlaps the isolation structure 210, and the lens opening 320 overlaps the pixel opening 220, that, an orthographic projection of the first lens body 310 on the substrate 100 is a lens projection, an orthographic projection of the pixel opening 220 on the substrate 100 is a pixel projection, and a distance d between at least a portion of an edge of the lens projection and an edge of the pixel projection is zero.

The orthographic projection of the first lens body 310 on the substrate 100, that is, a projection of the first lens body 310 on the substrate 100 in a thickness direction (an Z direction in FIG. 2) is the lens projection. The orthographic projection of the pixel opening 220 on the substrate 100, that is, an orthographic projection of the pixel opening 220 on the substrate 100 in the thickness direction, is the pixel projection.

The distance d between a portion of the edge of the lens projection and the edge of the pixel projection is zero, that is, there are at least adjacent positions between the lens projection and the pixel projection.

In the display panel 10 provided by the embodiments of the present disclosure, the display panel 10 includes the substrate 100, the pixel definition layer 200, and the first lens layer 300. The pixel definition layer 200 includes the isolation structure 210 and the pixel opening 220. The pixel opening 220 is used for accommodating a light-emitting device 230. The isolation structure 210 avoids crosstalk of light emitted by the light-emitting device 230 in adjacent pixel openings 220. The first lens layer 300 is disposed on the side of the pixel definition layer 200 away from the substrate 100. The light emitted by the light-emitting device 230 exits through the first lens layer 300, and the first lens body 310 can change an exit path of the light so that more light is emitted from directly above the light-emitting device 230, thereby improving luminous efficiency of the light-emitting device 230.

Figure 3:
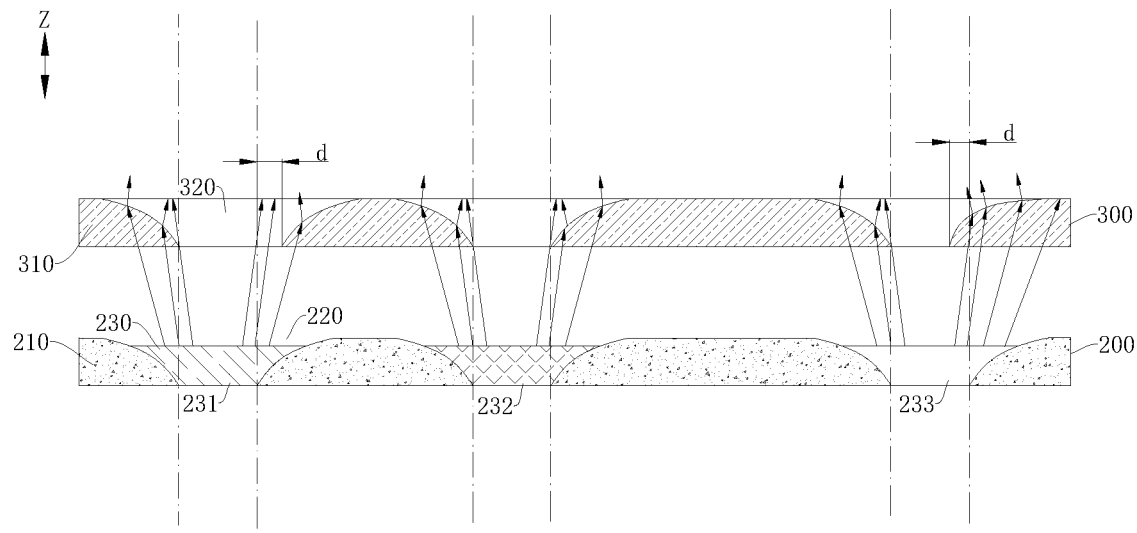
FIG. 3 is a schematic diagram of a partial layer structure of an exemplary display panel according to various embodiments of the present disclosure.

Referring to FIG. 3, to show a relative positional relationship between the first lens layer 300 and the pixel definition layer 200 more clearly, only the first lens layer 300 and the pixel definition layer 200 are shown in FIG. 3. The display panel 10 may also include other layer structures. In FIG. 3, to more clearly show the positional relationship between the first lens body 310 and the lens opening 320 of the first lens layer 300, and the isolation structure 210 and the pixel opening 220 of the pixel definition layer 200, multiple reference lines are made. The reference lines are indicated by dash-dotted lines. The dash-dotted lines don't constitute a limitation on structures of the display panel 10 of the embodiments of the present disclosure.

A size of a first pixel opening 220 from a left in FIG. 3 is smaller than a size of the lens opening 320, a size of the pixel projection is smaller than a size of a lens opening projection, the pixel projection is within the lens opening projection, and a distance d between a portion of the edge of the lens projection and the edge of the pixel projection is zero. An orthographic projection of the lens opening 320 on the substrate 100 is the lens opening projection. A size of a middle pixel opening 220 is equal to the size of the lens opening 320, and the lens opening projection overlaps completely the pixel projections, that is, a distance d between all the edge of the lens projection and the edge of the pixel projection is zero. A size of a third lens opening 320 from the left is smaller than a size of the pixel opening 220, the size of the lens opening projection is smaller than the size of the pixel projection, and the lens opening projection is within the pixel projection, that is, a distance d between a portion of the edge of the lens projection and the edge of the pixel projection is zero.

It can be seen from FIG. 3 that compared with light output of a second light-emitting device 230 from the left, light output of a first light-emitting device 230 from the left through the lens opening 320 is larger, and more light emits without passing through the first lens body 310. In a molding process of the first lens layer 300, when the lens opening 320 is formed, an inclined surface is formed on a side of the first lens body 310 facing the lens opening 320, and an exit path of light is changed when the light passes through the inclined surface. Compared with the light output of the second light-emitting device 230 from the left, more light emitted by a third light-emitting device 230 from the left passes through the inclined plane.

Therefore, it can be seen from FIG. 3 that when the distance d between the edge of the lens projection and the edge of the pixel projection is zero, that is, a portion of the edge of the lens projection is adjacent to at least a portion of the edge of the pixel projection, and an edge of the first lens body 310 is aligned with an edge of the pixel opening 220 along the thickness direction, more large-angle light emitted by the light-emitting device 230 can be converted into small-angle light, and light extraction efficiency is increased, so that more light is emitted from directly above the light-emitting device 230 and its vicinity, thereby improving luminous efficiency of the display panel 10. In the display panel 10 provided by the embodiments of the present disclosure, the distance d between at least a portion of the edge of the lens projection and the edge of the pixel projection is zero, which can further improve the luminous efficiency of the display panel 10.

Figure 4:
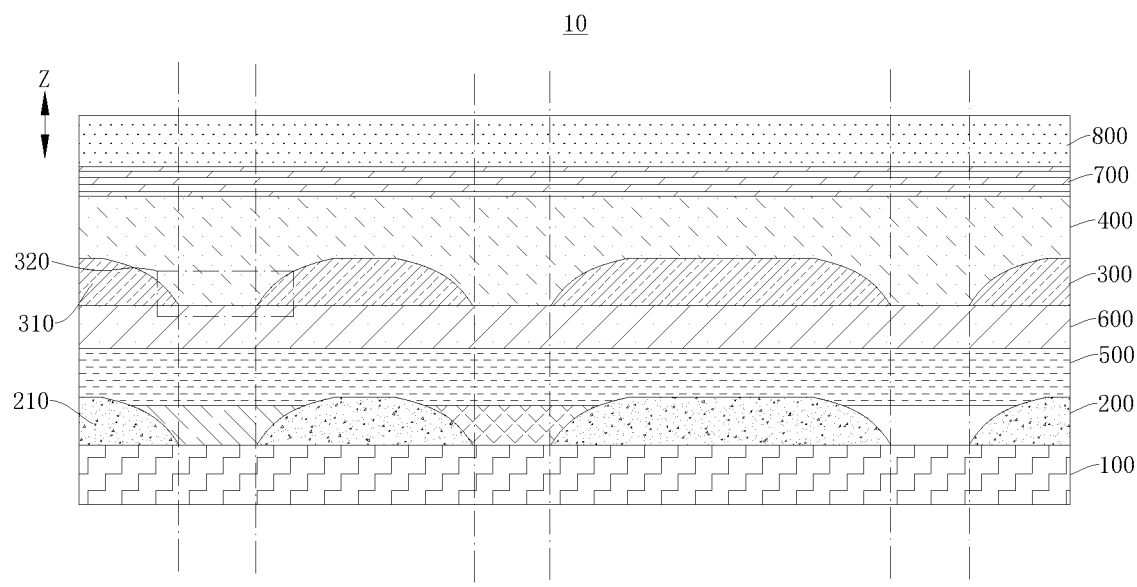
FIG. 4 is a cross-sectional view at A-A in FIG. 1 according to various embodiments of the present disclosure.

FIG. 4 is a cross-sectional view at A-A in FIG. 1 according to various embodiments of the present disclosure.

As shown in FIG. 4, in other embodiments, the distance d between all the edge of the lens projection and the edge of the pixel projection is zero. That is, the lens opening 320 and the pixel opening 220 completely overlap with each other in the thickness direction, and the first lens body 310 and the isolation structure 210 completely overlap with each other in the thickness direction.

Continuing to refer to FIG. 2 or FIG. 4, in some alternative embodiments, the display panel 10 further includes a second lens layer 400, and the second lens layer 400 is on a side of the first lens layer 300 away from the pixel definition layer 200.

Figure 5:
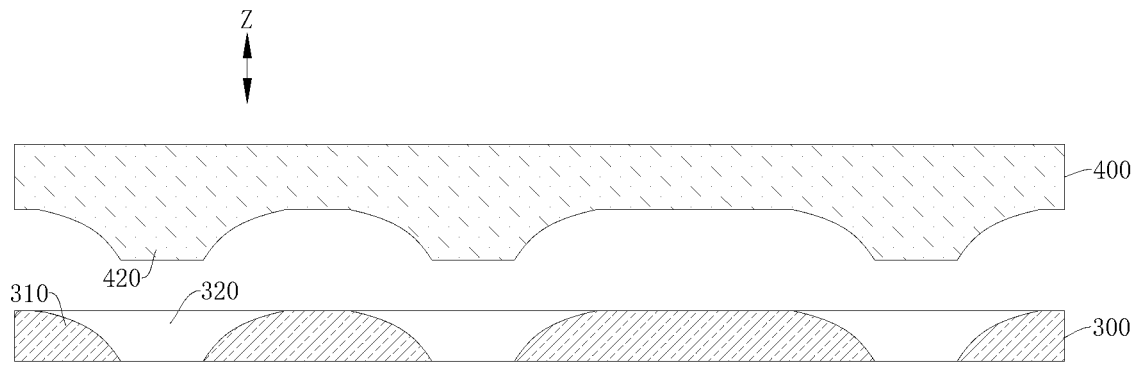
FIG. 5 is a schematic diagram of a partial layer structure of an exemplary display panel according to various embodiments of the present disclosure.

FIG. 5 is a schematic diagram of a partial layer structure of an exemplary display panel according to various embodiments of the present disclosure.

FIG. 5 only illustrates a relative positional relationship between the second lens layer 400 and the first lens layer 300. The display panel 10 may also include other layer structures. In the embodiments shown in FIG. 5, the second lens layer 400 includes a second lens body 410 and a lens protrusion 420 protruding above the second lens body 410, and the lens protrusion 420 is located in the lens opening 320.

Optionally, a refractive index of the first lens layer 300 is smaller than a refractive index of the second lens layer 400. When the light by the light-emitting device 230 in the pixel opening 220 passes through the first lens layer 300 and the second lens layer 400 in sequence, the large-angle light emitted by the light-emitting device 230 becomes the small-angle light, so that more light can emit from directly above the light-emitting device 230, which improves the luminous efficiency of the light-emitting device 230.

Optionally, the display panel 10 further includes an encapsulation layer 500 disposed on the side of the pixel definition layer 200 away from the substrate 100, a touch layer 600 disposed on a side of the encapsulation layer 500 away from the pixel definition layer 200, a polarizer 700 on a side of the second lens layer 400 away from the first lens layer 300, and a cover plate 800 on a side of the polarizer 700 away from the second lens layer 400.

There are many ways to arrange the pixel opening 220. Continuing to refer to FIGS. 1 and 3, the pixel opening 220 includes, for example, a first pixel opening 221, a second pixel opening 222, and a third pixel opening 223. The light-emitting device 230 includes, for example, a first color light-emitting device 231, a second color light-emitting device 232, and a third color light-emitting device 233. The first color light-emitting device 231 is located in the first pixel opening 221, the second color light-emitting device 232 is located in the second pixel opening 222, and the third color light-emitting device 233 is located in the third pixel opening 223.

The first color light-emitting device 231, for example, emits red light, the second color light-emitting device 232, for example, emits green light, and the third color light-emitting device 233, for example, emits blue light, to realize color display of the display panel 10.

The pixel projection includes a first pixel projection, a second pixel projection, and a third pixel projection. An orthographic projection of the first pixel opening 221 on the substrate 100 is the first pixel projection, an orthographic projection of the second pixel opening 222 on the substrate 100 is the second pixel projection, and an orthographic projection of the third pixel opening 223 on the substrate 100 is the third pixel projection.

An area of the first pixel projection is S1. A region with a zero-distance between an edge of the first pixel projection and the edge of the lens projection has a first overlapping edge length C1, that is, a sum of lengths of overlapping portions of the edge of the first pixel projection and the edge of the orthographic projection of a peripheral first lens body on the substrate is C1. An area of the second pixel projection is S2. A region with a zero-distance between an edge of the second pixel projection and the edge of the lens projection has a second overlapping edge length C2, that is, a sum of lengths of overlapping portions of the edge of the second pixel projection and the edge of the orthographic projection of a peripheral first lens body on the substrate is C2. An area of the third pixel projection is S3. A region with a zero-distance between an edge of the third pixel projection and the edge of the lens projection has a third overlapping edge length C3, that is, a sum of lengths of overlapping portions of the edge of the third pixel projection and the edge of the orthographic projection of a peripheral first lens body on the substrate is C3.

Optionally, when a portion of the edge of the first lens body 310 and a portion of the edge of the first pixel opening 221 overlap with each other in the thickness direction, and a distance d between this portion of the edge of the first pixel projection and this portion of the edge of the projection of the first lens body 310 is zero, a length of this portion of the edge of the first pixel projection or a length of this portion of the edge of the projection of the first lens body 310 is the first overlapping edge length C1. The first overlapping edge length C1 refers to a length of an overlapping edge of the edge of the first pixel opening 221 and the edge of the first lens body 310 in the thickness direction. The first overlapping edge length C1 may be a length of an edge of the first lens body 310, or a length of multiple edges, or a length of a portion of an edge, etc. In a same way, the second overlapping edge length C2 and the third overlapping edge length C3 can be obtained.

There is:

$$\left|\frac{M-N}{M+N}\right| \le 0.04, \quad (1).$$

M is one of C1/S1, C2/S2, C3/S3, and N is another of C1/S1, C2/S2, C3/S3 that is different from M. For example, when M is C1/S1, N is C2/S2 and/or C3/S3; when M is C2/S2, N is C1/S1 and/or C3/S3; and when M is C3/S3, N is C1/S1 and/or C2/S2.

Continuing to refer to FIG. 1, in some embodiments, sizes of the first pixel opening 221, the second pixel opening 222, and the third pixel opening 223, are different. In other embodiments, shapes of the first pixel opening 221, the second pixel opening 222, and the third pixel opening 223, may also be different. That is, shapes and sizes of the first color light-emitting device 231, the second color light-emitting device 232, and the third color light-emitting device 233, may be different, which leads to differences in C/S corresponding to different color light-emitting devices 230, and light extraction rates of corresponding colors are different and uncontrollable. The C/S is a ratio of an overlapping edge length C of the pixel projection corresponding to the light-emitting device 230 and the lens projection, and an area S of the pixel projection corresponding to the light-emitting device 230.

In the embodiments of the present disclosure, when M and N satisfy the above relational formula, the light extraction rate of the first lens layer 300 and the second lens layer 400 to the light-emitting device 230 in the pixel opening 220 corresponding to M and N tends to be consistent. Therefore, color shift phenomenon of the display panel 10 can be improved.

Experiments show that when M and N satisfy the above relational formula (1), for example, when M is C1/S1 and N is C2/S2, efficiency raising ratio by the display panel for light emitted by the first light-emitting device 231 and the second light-emitting device 232 fluctuates within ±3%.

In other optional embodiments, to further improve light efficiency, M and N satisfy the following relationship:

$$\left|\frac{M-N}{M+N}\right| \le 0.02, \quad (2).$$

Experiments show that when M and N satisfy the above-mentioned relational formula (2), for example, when M is C1/S1 and N is C2/S2, the efficiency raising ratio by the display panel for light emitted by the first light-emitting device 231 and the second light-emitting device 232 fluctuates within ±1%.

For example, when M is C1/S1 and N is C2/S2, the pixel opening 220 corresponding to M is the first pixel opening 221, and the pixel opening 220 corresponding to N is the second pixel opening 222. When M and N satisfy the above relational formula, light efficiency improvement effects of the first lens layer 300 and the second lens layer 400 on light emitted by the first color light-emitting device 231 and the second color light-emitting device 232 tend to be consistent, so that color shift between light emitted by the first color light-emitting device 231 and light emitted by the second color light-emitting device 232 is improved, and display effect of the display panel 10 is improved.

In some optional embodiments, M and N are any two of C1/S1, C2/S2, C3/S3. That is, any two of C1/S1, C2/S2, and C3/S3 satisfy the above-mentioned relational formula (1). The color shift of the display panel 10 can be further improved.

In still other alternative embodiments, C1/S1=C2/S2=C3/S3, which makes the light efficiency improvement effects of the first lens layer 300 and the second lens layer 400 on light emitted by the first color light-emitting device 231, the second color light-emitting device 232, and the third color light-emitting device 233, tend to be consistent, thereby further improving the color shift of the display panel 10.

In any of the foregoing embodiments, a distance d between at least a portion of the edge of the lens projection and the edge of the pixel projection being zero, includes at least two cases as follows.

In a first case as shown in FIGS. 1 to 2, a distance d between at least a portion of the edge of the lens projection and the edge of the pixel projection is zero, and a distance d between another portion of the edge of the lens projection and the edge of the pixel projection is greater than zero.

In a second case as shown in FIG. 4, a distance d between the edge of the lens projection and the edge of the pixel projection is zero, that is, the lens projection and the pixel projection don't overlap with each other at all, the first lens body 310 and the pixel opening 220 don't overlap with each other at all in the thickness direction, and the lens opening 320, the lens protrusion 420, and the pixel opening 220, completely overlap with each other in the thickness direction.

For the first case, there are at least three exemplary embodiments as follows.

In exemplary Embodiment 1, the edge of the first lens body 310 and the pixel opening 220 don't overlap with each other in a region where d>0.

In exemplary Embodiment 2, the edge of the first lens body 310 and the pixel opening 220 overlap with each other in the region where d>0.

In exemplary Embodiment 3, a portion of the edge of the first lens body 310 and the pixel opening 220 don't overlap with each other in the region where d>0, and another portion of the edge of the first lens body 310 and the pixel opening 220 overlap with each other in the region where d>0.

Figure 6:
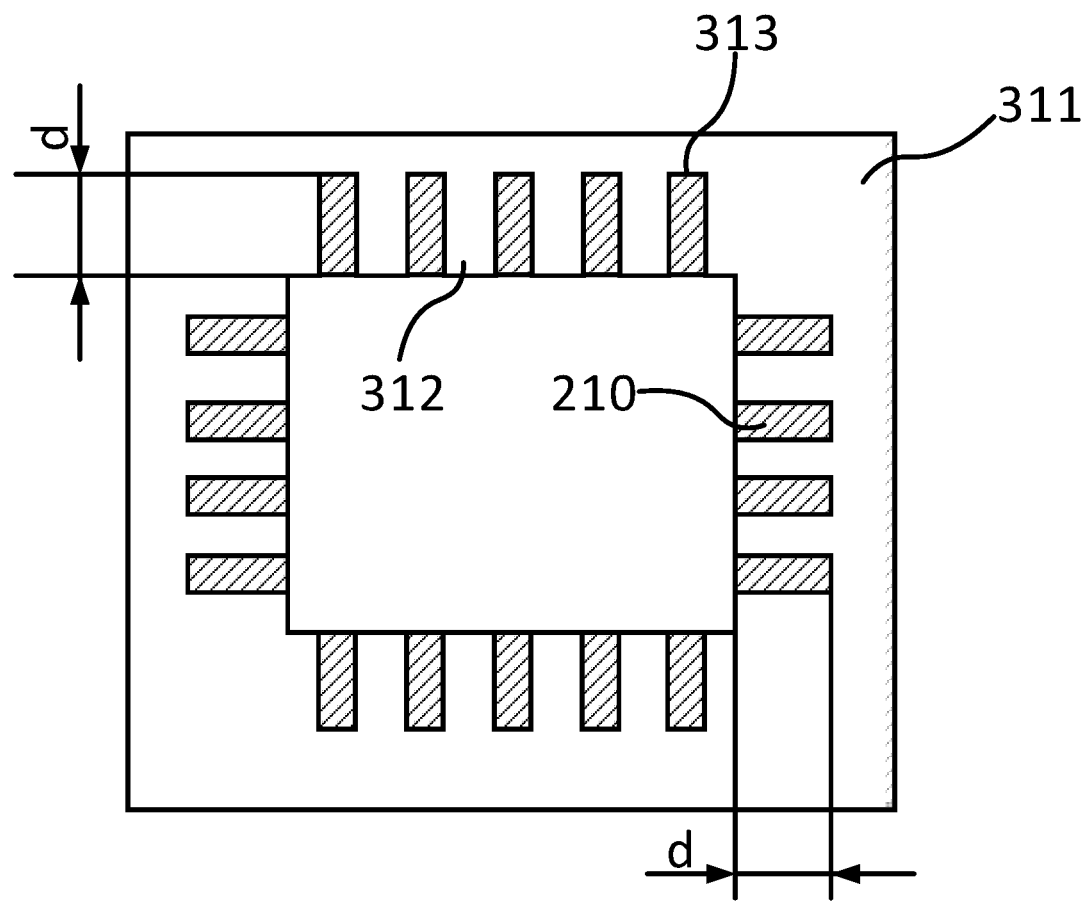
FIG. 6 is a partial top view of an exemplary display panel in a first case according to various embodiments of the present disclosure.

FIG. 6 illustrates a relative positional relationship between one pixel opening 220 and the first lens body 310. Referring to FIG. 6, in Embodiment 1, optionally, the first lens body 310 includes a first body portion 311 and a plurality of first convex portions 312 protruding above the first body portion 311. A first gap 313 is included between two adjacent first convex portions 312. A distance between an edge of orthographic projections of the first convex portions 312 on the substrate 100 and the edge of the pixel projection is zero, and the orthographic projections of the first convex portions 312 on the substrate 100 don't overlap the pixel projection. As shown in FIG. 6, the isolation structure 210 is exposed by the first gap 313.

In these alternative embodiments, the first lens body 310 expands outwards with respect to the pixel opening 220, that is, a distribution size of the first lens body 310 is smaller than a distribution size of the isolation structure 210, and the lens projection is within an orthographic projection of the isolation structure 210 on the substrate 100. That is, the pixel projection is within an orthographic projection of the lens protrusion 420 on the substrate 100. By reasonably adjusting a size of the first convex portions 312, the overlapping edge length of the lens projection and the pixel projection can be adjusted.

For example, when the pixel projection includes the above-mentioned first pixel projection, second pixel projection, and third pixel projection, by reasonably adjusting the size of the first convex portions 312, values of the first overlapping edge length C1, the second overlapping edge length C2, and the third overlapping edge length C3, can be adjusted to make C1/S1, C2/S2, and C3/S3 to satisfy the above-mentioned relational formula (1).

Optionally, widths of first gaps 313 between adjacent first convex portions 312 are equal, where a width is a distance along an arrangement direction of the first convex portions 312. For example, the pixel projection is polygonal (as shown in FIG. 6, the pixel projection is quadrilateral). The first convex portions 312 are distributed at intervals at the edge of the pixel projection. A plurality of first convex portions 312 is distributed at intervals at an edge of the pixel projection, and an arrangement direction of the plurality of first convex portions 312 corresponding to different edges may be different. The arrangement direction of the first convex portions 312 may be considered as an extension direction of the edge of the pixel projection. In other embodiments, the pixel projection is, for example, elliptical or circular, and the plurality of first convex portions 312 are distributed at intervals on an arc-shaped edge of the pixel projection.

In these alternative embodiments, when the widths of the first gaps 313 between adjacent first convex portions 312 are equal, sizes of the first gaps 313 at different positions of the edge of the pixel projection can be made to tend being consistent, and the light efficiency improvement effects to corresponding light-emitting devices 230 at different positions of the edge of the pixel projection can be made to tend being consistent, thereby further improving the display effect of the display panel 10.

Figure 7:
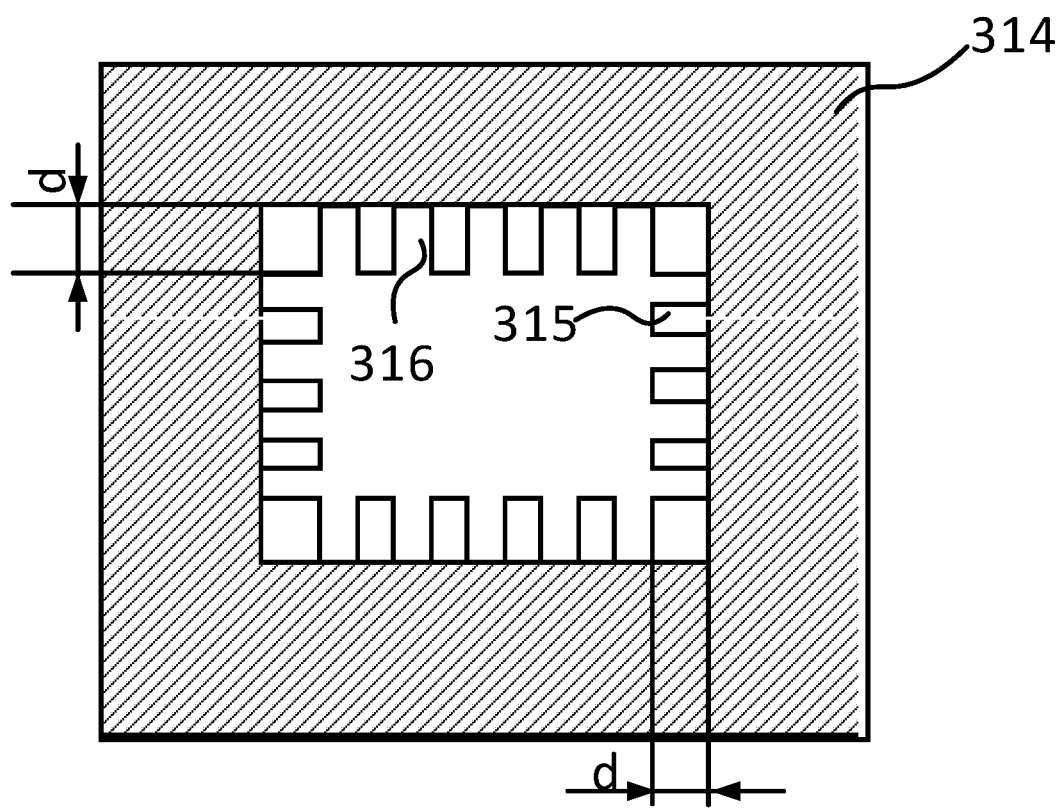
FIG. 7 is a partial top view of an exemplary display panel in a first case according to various embodiments of the present disclosure.

FIG. 7 is a partial top view of an exemplary display panel in a first case according to various embodiments of the present disclosure.

Referring to FIG. 7, in Embodiment 2, there are many ways to arrange the first lens layer 300. Optionally, the first lens body 310 includes a second body portion 314 and a plurality of second convex portions 315 protruding above the second body portion 314. A second gap 316 is included between two adjacent second convex portions 315. Orthographic projections of the second convex portions 315 on the substrate 100 are within the pixel projection.

In these alternative embodiments, the first lens body 310 is retracted relative to the pixel opening 220. A distance d between an edge of an orthographic projection of the second body portion 314 on the substrate 100 and the edge of the pixel projection is zero, that is the distribution size of the first lens body 310 is larger than the distribution size of the isolation structure 210, and the orthographic projection of the isolation structure 210 on the substrate 100 is within the lens projection. That is, the orthographic projection of the lens protrusion 420 on the substrate 100 is within the pixel projection. By reasonably adjusting a size of the second convex portions 315, the overlapping edge length of the lens projection and the pixel projection can be adjusted.

For example, when the pixel projection includes the above-mentioned first pixel projection, second pixel projection, and third pixel projection, by reasonably adjusting the size of the second convex portions 315, an overlapping edge length of the orthographic projection of the second body portion 314 on the substrate 100 and the pixel projection can be adjusted, that is, the values of the first overlapping edge length C1, the second overlapping edge length C2, and the third overlapping edge length C3, can be adjusted to make C1/S1, C2/S2, and C3/S3 to satisfy the above-mentioned relational formula (1).

Optionally, widths of second gaps 316 between adjacent second convex portions 315 are equal, where a width is a distance along an arrangement direction of the second convex portions 315. The pixel projection is, for example, polygonal. The second convex portions 315 are distributed at intervals on the edge of the pixel projection, and a plurality of second convex portions 315 is distributed at intervals on an edge of the pixel projection. An arrangement direction of the plurality of second convex portions 315 corresponding to different edges may be different, and the arrangement direction of the second convex portions 315 can be regarded as the extension direction of the edge of the pixel projection. In other embodiments, the pixel projection is, for example, elliptical or circular, and the plurality of second convex portions 315 are distributed at intervals on an arc-shaped edge of the pixel projection.

In these alternative embodiments, when the widths of the second gaps 316 between adjacent second convex portions 315 are equal, sizes of the second gaps 316 at different positions of the edge of the pixel projection can be made to tend being consistent, and the light efficiency improvement effects to corresponding light-emitting devices 230 at different positions of the edge of the pixel projection can be made to tend being consistent, thereby further improving the display effect of the display panel 10.

In one embodiment, the pixel opening 220 includes a first pixel opening, a second pixel opening, and a third pixel opening, that the first pixel opening, the second pixel opening, and the third pixel opening, are respectively provided with a first color light-emitting device, a second color light-emitting device, and a third color light-emitting device. A wavelength of a first color light is greater than a wavelength of a second color light, and the wavelength of the second color light is greater than a wavelength of a third color light. A length of the second convex portions 315 overlapping the first pixel opening in an extension direction of the second convex portions 315 is L1, a length of the second convex portions 315 overlapping the second pixel opening in the extension direction of the second convex portions 315 is L2, and a length of the second convex portions 315 overlapping the third pixel opening in the extension direction of the second convex portions 315 is L3, where L3>L2>L1. In this embodiment, the wavelength of the third color light corresponding to the third color light-emitting device is the shortest, and a deflection angle of the third color light under a same incident angle will be greater than a deflection angle of the first color light and the second color light. Accordingly, the second convex portions corresponding to the third color light-emitting device are closer to the pixel opening, which can ensure that a deflection position of the third color light is closer to a center of the pixel opening than that of the first color light, can ensure the light output of the third color light, and balance the light improvement efficiency of different color light-emitting devices through the lens.

Figure 8:
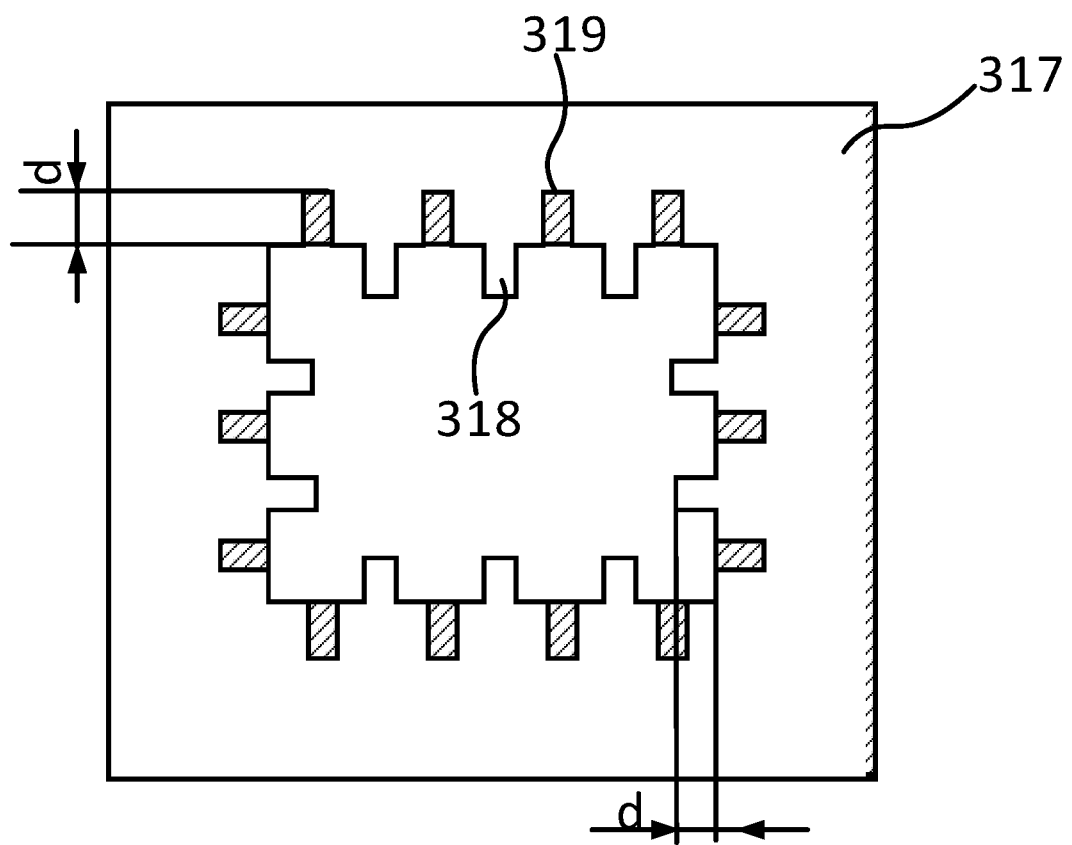
FIG. 8 is a partial top view of an exemplary display panel in a first case according to various embodiments of the present disclosure.

FIG. 8 is a partial top view of an exemplary display panel in a first case according to various embodiments of the present disclosure.

Referring to FIG. 8, in Embodiment 3, the first lens layer 300 can be arranged in various ways. Optionally, the first lens body 310 includes a third body portion 317, a third convex portion 318 protruding above the third body portion, and a third groove 319 formed by the recessed third body portion, that a distance between an edge of an orthographic projection of the third body portion and the edge of the pixel projection is zero, an orthographic projection of the third convex portion 318 is within the pixel projection, and an orthographic projection of the third groove 319 is outside the pixel projection.

In these alternative embodiments, the distance d between the edge of the orthographic projection of the third body portion on the substrate 100 and the edge of the pixel projection is zero. The orthographic projection of the third convex portion 318 on the substrate 100 is within the pixel projection, that is, the third convex portion 318 overlaps the pixel opening 220 in the thickness direction. The orthographic projection of the third groove 319 on the substrate 100 is outside the pixel projection, that is, the third groove 319 and the pixel opening 220 don't overlap with each other in the thickness direction. By reasonably adjusting sizes of the third convex portion 318 and the third groove 319, the overlapping edge length of the lens projection and the pixel projection can be adjusted.

Figure 9:
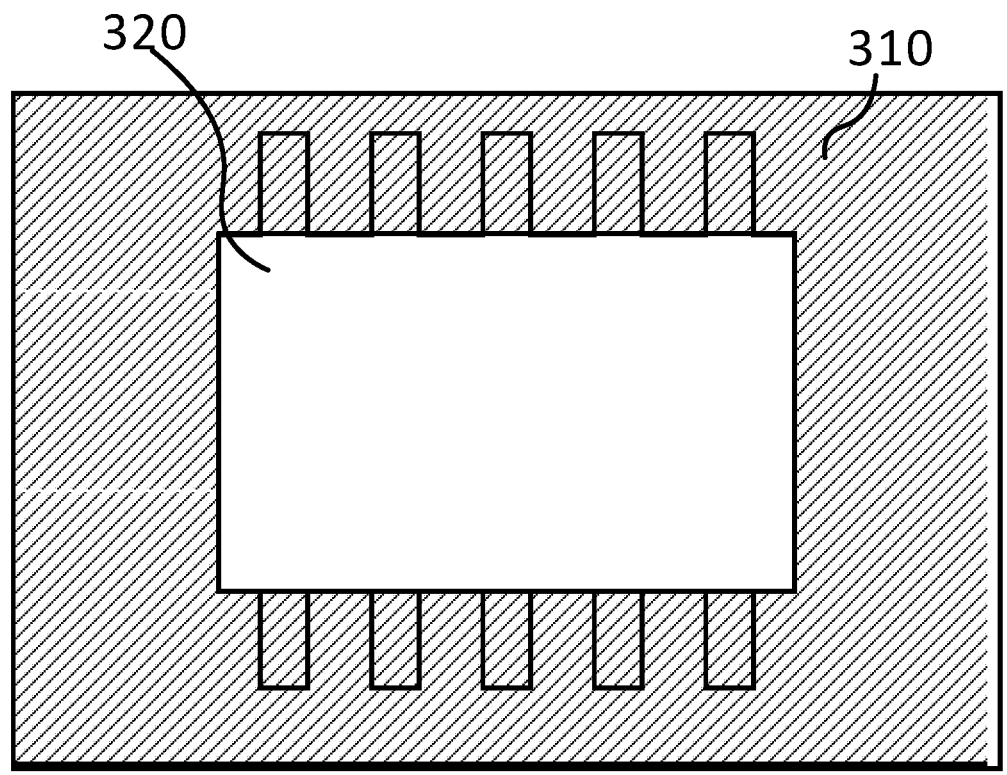
FIG. 9 is a partial top view of an exemplary display panel in a first case according to various embodiments of the present disclosure.

FIG. 9 is a partial top view of an exemplary display panel in a first case according to various embodiments of the present disclosure.

Referring to FIG. 9, in the first case, optionally, the pixel opening 220 is polygonal. The pixel projection includes at least a long side and a short side, and an extension size of the long side is greater than an extension size of the short side. An overlapping size of the edge of the lens projection and an edge of a projection of the long side is less than or equal to an overlapping size of the edge of the lens projection and an edge of a projection of the short side.

In these alternative embodiments, since a size of the long side of the pixel projection is larger than a size of the short side, light effect intensity near the pixel opening 220 corresponding to the long side of the pixel projection is greater than light effect near the pixel opening 220 corresponding to the short side. When the overlapping size of the edge of the lens projection and the edge of the projection of the long side is less than or equal to the overlapping size of the edge of the lens projection and the edge of the projection of the short side, the light improvement efficiency of the first lens body 310 corresponding to the long side of the lens projection is less than or equal to the light improvement efficiency of the first lens body 310 corresponding to the short side of the lens projection. In this way, a difference between the light effect intensity near the pixel opening 220 corresponding to the long side of the pixel projection and the light effect intensity near the pixel opening 220 corresponding to the short side can be reduced, a problem of inconsistent color rendering of the display panel 10 in different directions can be improved, and the display effect of the display panel 10 can be further improved.

As shown in FIG. 9, the pixel opening 220, for example, has a rectangular shape. The pixel opening 220 has two oppositely disposed long sidewalls and two oppositely disposed short sidewalls. A size of the light-emitting device 230 corresponding to the long sidewalls is larger than a size of the light-emitting device 230 corresponding to the short sidewalls, resulting in that the light intensity near the long sidewalls is stronger than the light intensity near the short sidewalls.

Figure 10:
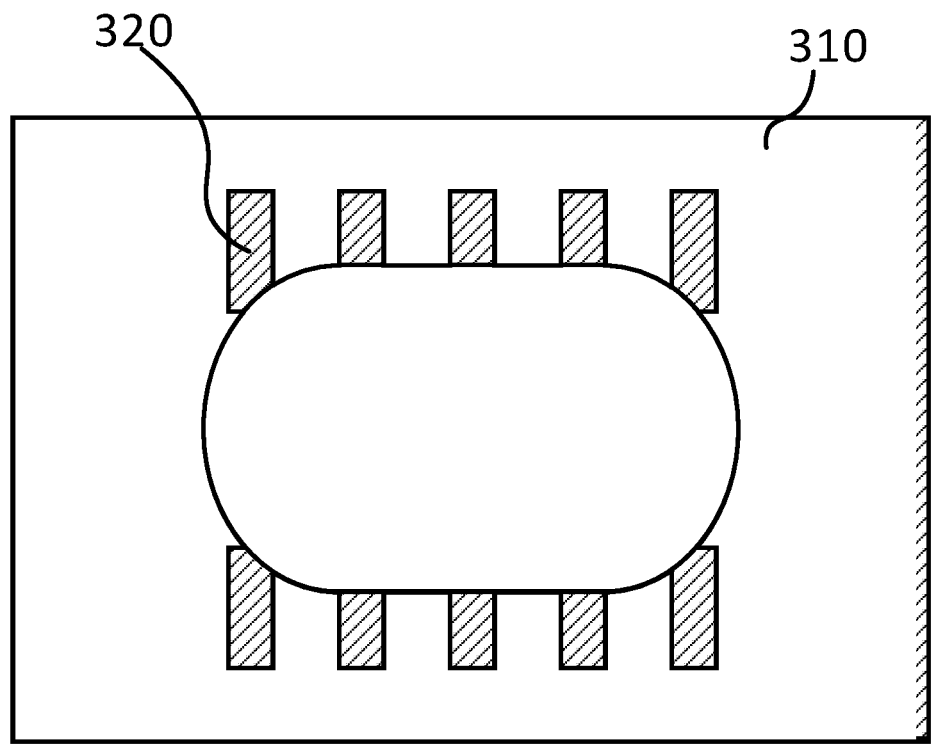
FIG. 10 is a partial top view of an exemplary display panel in a first case according to various embodiments of the present disclosure.

FIG. 10 is a partial top view of an exemplary display panel in a first case according to various embodiments of the present disclosure.

Referring to FIG. 10, optionally, the long sidewalls and the short sidewalls may be connected at a predetermined angle, or the long sidewalls and the short sidewalls may be smoothly connected. The angle between the long sidewalls and the short sidewalls can be an acute angle, an obtuse angle, or a right angle.

When the pixel opening 220 is rectangular, the pixel projection is rectangular and has two opposite long sides and two opposite short sides. When an overlapping size of the edge of the lens projection and projections of the long sides is less than or equal to an overlapping size of the edge of the lens projection and projections of the short sides, the light improvement efficiency of the first lens body 310 on the light emitted by the light-emitting device 230 near the long sidewalls is smaller, and the light improvement efficiency of the first lens body 310 on the light emitted by the light-emitting device 230 near the short sidewalls is larger. The difference between light intensity near the long sidewalls and light intensity near the short sidewalls can be reduced, thereby improving the problem of inconsistent color rendering of the display panel 10 in different directions, and further improving the display effect of the display panel 10.

In the first case, optionally, in the region where d>0 between the edge of the first lens body 310 and the pixel opening 220, the distance between the edge of the lens projection and the edge of the pixel projection is proportional to the area of the corresponding pixel projection.

In these alternative embodiments, a distance on a reference plane between the edge of the first lens body 310 and the pixel opening 220 can affect the light improvement efficiency of the first lens body 310 on the light emitted by the light-emitting device 230 in the pixel opening 220. When the distance between the edge of the first lens body 310 and the edge of the pixel opening 220 is closer, that is, the distance between the edge of the lens projection and the edge of the pixel projection is closer, the light improvement efficiency of the first lens body 310 on the light emitted by the light-emitting device 230 in the pixel opening 220 is higher. The larger the size of the pixel opening 220, the larger the size of the light-emitting device 230, and the greater the light amount of the light-emitting device 230. That is, the larger the area of the pixel projection, the more the light amount of the light-emitting device 230. Therefore, when the distance between the edge of the lens projection and the edge of the pixel projection is proportional to the area of the corresponding pixel projection, a light amount difference between light-emitting devices 230 corresponding to the pixel projection with different areas can be improved, and the display effect of the display panel 10 can be further improved. The reference plane is a plane perpendicular to the thickness direction of the display panel 10.

In some optional embodiments, in the region where d>0 between the edge of the lens projection and the edge of the pixel projection, a first distance d1 is between the edge of the lens projection and the edge of the first pixel projection, a second distance d2 is between the edge of the lens projection and the edge of the second pixel projection, and a third distance d3 is between the edge of the lens projection and the edge of the third pixel projection. The area of the first pixel projection is smaller than the area of the second pixel projection, and the area of the second pixel projection is smaller than the area of the third pixel projection. The first distance d1 is smaller than the second distance d2, and the second distance d2 is smaller than the third distance d3.

In these alternative embodiments, the area of the first pixel projection is smaller than the area of the second pixel projection, and the area of the second pixel projection is smaller than the area of the third pixel projection, therefore light amount of the first light-emitting device 231 is smaller than light amount of the second light-emitting device 232, and the light amount of the second light-emitting device 232 is smaller than light amount of the third light-emitting device 233. When the first distance d1 is smaller than the second distance d2, and the second distance d2 is smaller than the third distance d3, the light improvement efficiency of the first lens body 310 to the first light-emitting device 231 is greater than the light improvement efficiency of the first lens body 310 to the second light-emitting device 232, and the light improvement efficiency of the first lens body 310 to the second light-emitting device 232 is greater than the light improvement efficiency of the first lens body 310 to the third light-emitting device 233, which can reduce a light amount difference among the first light-emitting device 231, the second light-emitting device 232, and the third light-emitting device 233, thereby improving the color shift of the display panel 10 and improving the display effect.

Figure 11:
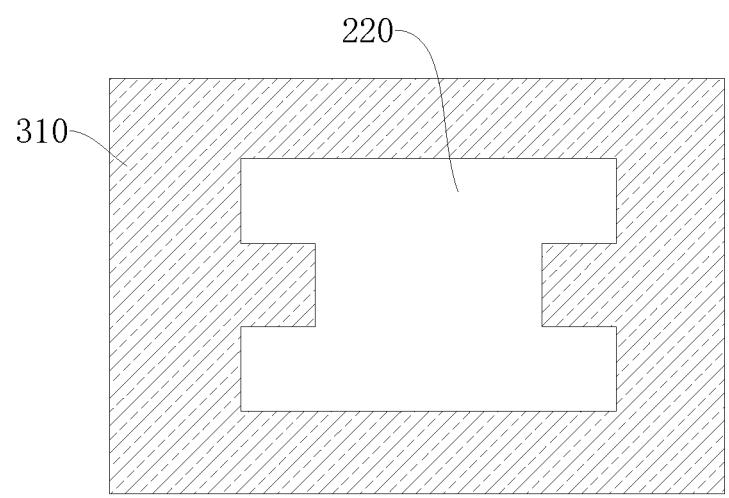
FIG. 11 is a partial top view of an exemplary display panel in a second case according to various embodiments of the present disclosure.
Figure 12:
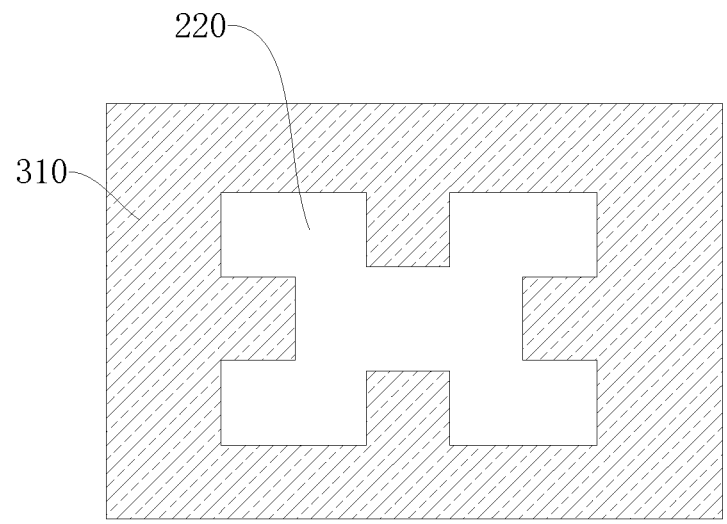
FIG. 12 is a partial top view of an exemplary display panel in a second case according to various embodiments of the present disclosure.
Figure 13:
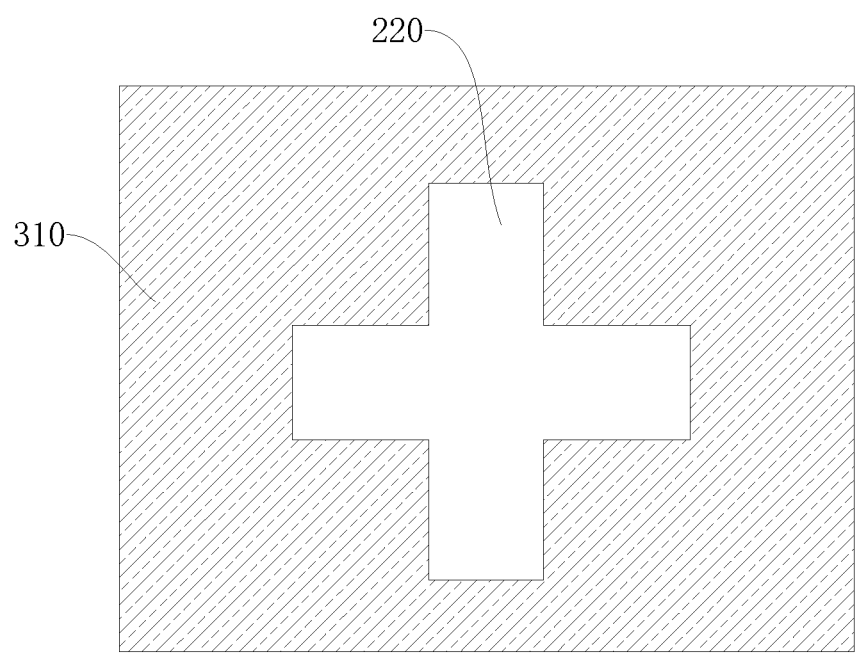
FIG. 13 is a partial top view of an exemplary display panel in a second case according to various embodiments of the present disclosure.
Figure 14:
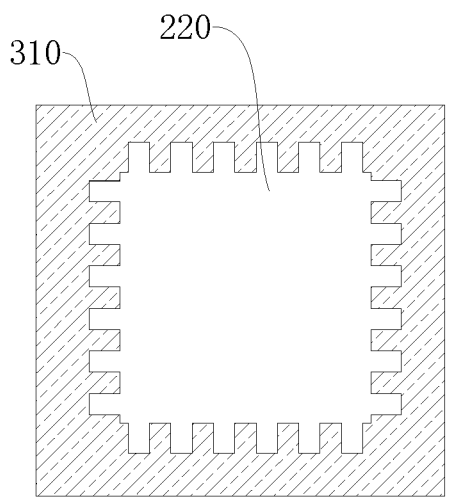
FIG. 14 is a partial top view of an exemplary display panel in a second case according to various embodiments of the present disclosure.

FIG. 11 is a partial top view of an exemplary display panel in a second case according to various embodiments of the present disclosure. FIG. 12 is a partial top view of an exemplary display panel in a second case according to various embodiments of the present disclosure. FIG. 13 is a partial top view of an exemplary display panel in a second case according to various embodiments of the present disclosure. FIG. 14 is a partial top view of an exemplary display panel in a second case according to various embodiments of the present disclosure.

Referring to FIGS. 11 to 14, for the second case, the lens projection and the pixel projection don't overlap with each other at all, the first lens body 310 does not overlap the pixel opening 220 in the thickness direction at all, and a ratio of an edge length of the pixel projection to the area of the pixel projection is greater than or equal to 4.25%.

When the ratio of the edge length of the pixel projection to the area of the pixel projection is greater than or equal to 4.25%, a ratio of an edge length of the lens projection to the area of the pixel projection is greater than or equal to 4.25%, which can improve the light improvement efficiency of the first lens body 310 to the light-emitting device 230, thereby improving the luminous efficiency of the entire display panel 10.

It should be noted that the ratio of the edge length of the pixel projection to the area of the pixel projection is greater than or equal to 4.25%, where a unit of the edge length of the pixel projection is micrometer, and a unit of the area of the pixel projection is square micrometer. When a size of the pixel projection is 47.02 μm by 47.02 μm, the ratio of the edge length of the pixel projection (47.02+47.02 μm) to the area of the pixel projection (47.02×47.02 μm²) is just equal to 4.25%. A general size of an existing pixel projection is less than 47 μm, and for different rectangles with an equal area, a square has a smallest sum of the edge lengths. The ratio of the edge length of the pixel projection to the area of the pixel projection is greater than or equal to 4.25%, which can improve the light improvement efficiency of the first lens body 310 to the light-emitting device 230.

To increase the ratio of the edge length of the pixel projection to the area of the pixel projection, it is necessary to increase the edge length of the pixel projection while reducing the area of the pixel projection. There are many such settings. Optionally, the pixel projection includes at least a first straight edge, a second straight edge, and a third straight edge. The second straight edge is connected between the first straight edge and the third straight edge. An inner angle between the first straight edge and the third straight edge is greater than or equal to 180°. As shown in FIG. 11 and FIG. 12, among three successively connected edges, the inner angle between the first straight edge and the third straight edge is 360°. As shown in FIG. 13, among three consecutively connected edges, the inner angle between the first straight edge and the third straight edge is 180°. As shown in FIG. 14, among three consecutively connected edges, the inner angle between some first straight edges and third straight edges is 180°, and the inner angle between some other first straight edges and the third straight edges is 360°.

When the inner angle between the first straight edge and the third straight edge is greater than or equal to 180°, the second straight edge is arranged closer to an inside of the pixel projection than the first straight edge and the third straight edge, so that the edge of the pixel projection forms a groove, and the edge length of the pixel projection is increased while the area of the pixel projection is reduced.

Figure 15:
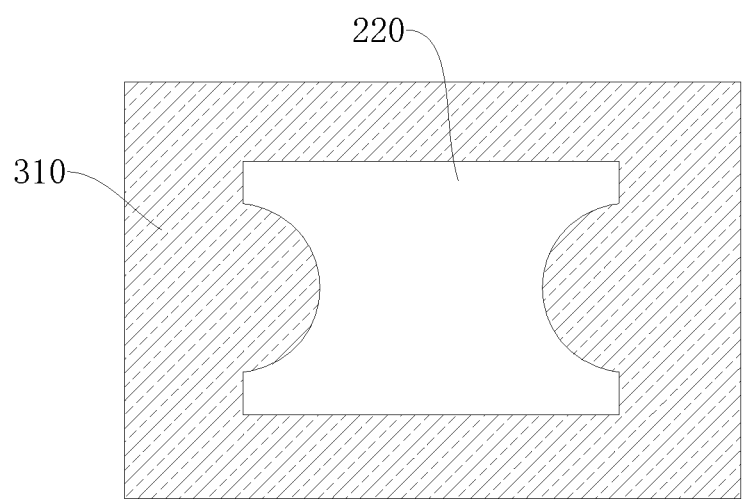
FIG. 15 is a partial top view of an exemplary display panel in a second case according to various embodiments of the present disclosure.

FIG. 15 is a partial top view of an exemplary display panel in a second case according to various embodiments of the present disclosure.

Referring to FIG. 15, in other embodiments, the pixel projection includes at least an arc-shaped edge, and the arc-shaped edge is recessed towards the pixel projection, so that a groove can be formed on the edge of the pixel projection, and the edge length of the pixel projection is increased while the area of the pixel projection is reduced.

Optionally, at least a portion of the edge of the pixel projection is formed by one of a sawtooth shape, a wave shape, an arc shape, or a combination thereof, so as to increase the edge length of the pixel projection while reducing the area of the pixel projection.

Figure 16:
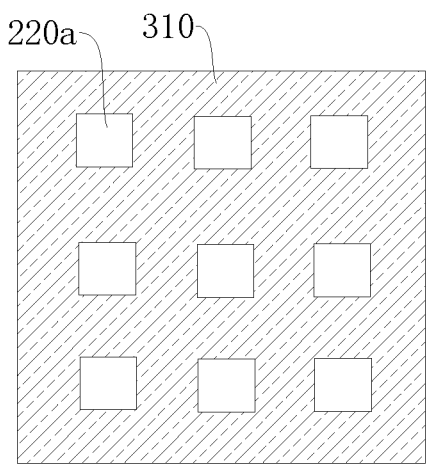
FIG. 16 is a partial top view of an exemplary display panel in a second case according to various embodiments of the present disclosure.

FIG. 16 is a partial top view of an exemplary display panel in a second case according to various embodiments of the present disclosure.

Referring to FIG. 16, in still other optional embodiments, the pixel opening 220 includes a plurality of sub-openings 220a distributed at intervals, and the edge of the pixel projection is formed by projections of outermost edges of the plurality of sub-openings 220a. By providing the plurality of sub-openings 220a, a sum of edge lengths of the plurality of sub-openings 220a is larger, which can increase the edge length of the pixel projection.

Figure 17:
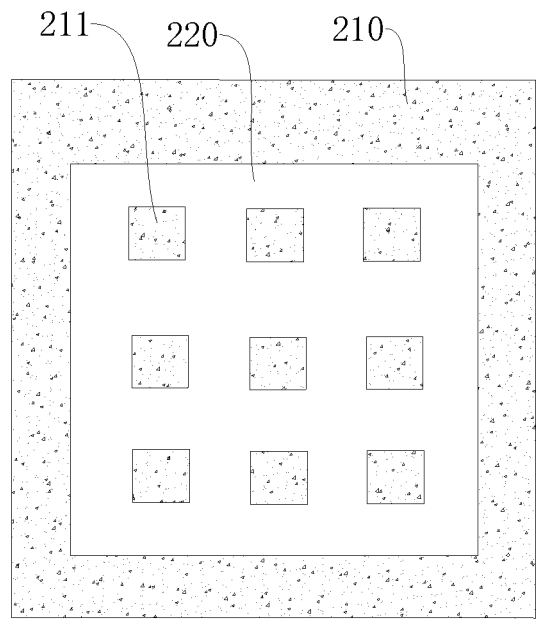
FIG. 17 is a partial top view of an exemplary display panel in a second case according to various embodiments of the present disclosure.

FIG. 17 is a partial top view of an exemplary display panel in a second case according to various embodiments of the present disclosure.

Referring to FIG. 17, a plurality of isolation pillars 211 are distributed at intervals in the pixel opening 220. By providing the isolation pillars 211, edges of the isolation pillars 211 are the edge of the pixel projection. The isolation pillars 211 can not only reduce the size of the pixel opening 220, but also increase the edge length of the pixel projection.

Figure 18:
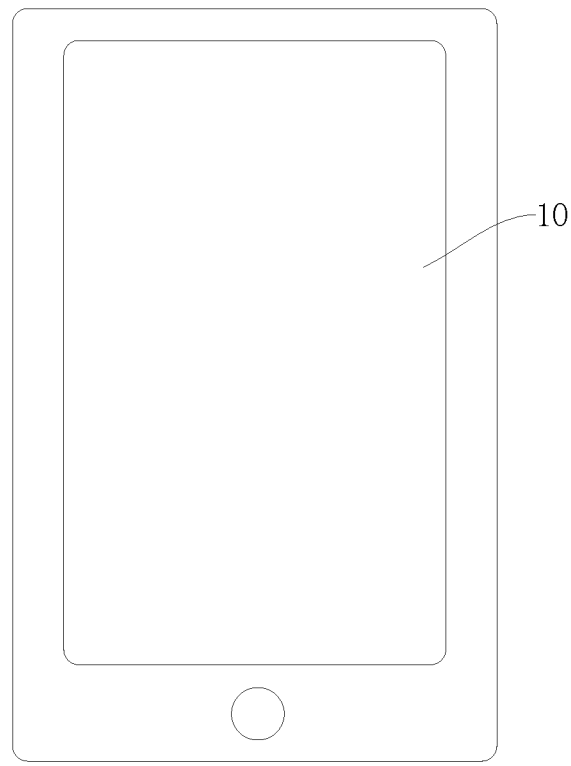
FIG. 18 is a schematic structural diagram of an exemplary display device according to various embodiments of the present disclosure.

FIG. 18 is a schematic structural diagram of an exemplary display device according to various embodiments of the present disclosure.

In a second aspect, the present disclosure also provides a display device, including the display panel provided by any one of the above-mentioned embodiments in the first aspect. Since the display device of the embodiments of the present disclosure has the display panel of any of the foregoing embodiments, the display device of the embodiments of the present disclosure has the beneficial effects of the foregoing display panel, and details are not described herein again.

The display device in the embodiments of the present disclosure includes, but is not limited to, a device with display functions, such as a mobile phone, a personal digital assistant (PDA), a tablet computer, an e-book, a television, an access control, a smart fixed phone, a console, etc.

In the display panel provided by the embodiments of the present disclosure, the display panel includes the substrate, the pixel definition layer, and the first lens layer. The pixel definition layer includes the isolation structure and the pixel opening. The pixel opening is used for accommodating the light-emitting device, and the isolation structure prevents crosstalk of the light emitted by the light-emitting device in adjacent pixel openings. The first lens layer is disposed on the side of the pixel definition layer away from the substrate, and the light emitted by the light-emitting device exits through the first lens layer, which can improve the luminous efficiency of the light-emitting device. The distance d between at least a portion of the edge of the lens projection and the edge of the pixel projection is zero, that is, at least a portion of the edge of the first lens body is aligned with the edge of the pixel opening in the thickness direction. When the light emitted by the light-emitting device passes through this portion of the edge of the first lens body, the exit angle is changed, so that the light emitted by the light-emitting device is emitted from directly above the light-emitting device and its vicinity, and the luminous efficiency of the display panel is improved.

Although the present disclosure has been described with reference to the embodiments, various modifications can be made to the present disclosure and components therein can be replaced with equivalents, without departing from the scope of the present disclosure. In particular, as long as there is no structural conflict, various technical features mentioned in the various embodiments can be combined in any manner. The present disclosure is not limited to the disclosed embodiments, but includes all technical solutions falling within the scope of the claims.

What is claimed is:

1. A display panel, comprising:
a substrate;
a pixel definition layer disposed on a side of the substrate, wherein the pixel definition layer includes an isolation structure and a pixel opening enclosed by the isolation structure; and
a first lens layer disposed on a side of the pixel definition layer away from the substrate, wherein the first lens layer includes a first lens body and a lens opening enclosed by the first lens body, and in a thickness direction of the display panel, the first lens body at least overlaps the isolation structure, and the lens opening overlaps the pixel opening,
wherein, an orthographic projection of the first lens body on the substrate is a lens projection, an orthographic projection of the pixel opening on the substrate is a pixel projection, and a distance between at least a portion of an edge of the lens projection and an edge of the pixel projection is substantially zero.

2. The display panel according to claim 1, wherein:
the pixel opening includes a first pixel opening, a second pixel opening, and a third pixel opening, wherein the first pixel opening, the second pixel opening, and the third pixel opening, are respectively provided with a first color light-emitting device, a second color light-emitting device, and a third color light-emitting device;
the pixel projection includes a first pixel projection, a second pixel projection, and a third pixel projection, wherein an orthographic projection of the first pixel opening on the substrate is the first pixel projection, an orthographic projection of the second pixel opening on the substrate is the second pixel projection, and an orthographic projection of the third pixel opening on the substrate is the third pixel projection;
an area of the first pixel projection is S1, a region with a zero-distance between an edge of the first pixel projection and the edge of the lens projection has a first overlapping edge length C1, an area of the second pixel projection is S2, a region with a zero-distance between an edge of the second pixel projection and the edge of the lens projection has a second overlapping edge length C2, an area of the third pixel projection is S3, and a region with a zero-distance between an edge of the third pixel projection and the edge of the lens projection has a third overlapping edge length C3; and $$\left|\frac{M-N}{M+N}\right| \leq 0.04,$$

wherein, M is one of C1/S1, C2/S2, C3/S3, and N is another of C1/S1, C2/S2, C3/S3 that is different from M.

3. The display panel according to claim 2, wherein:
M and N are any two of C1/S1, C2/S2, and C3/S3.

4. The display panel according to claim 3, wherein:
C1/S1=C2/S2=C3/S3.

5. The display panel according to claim 2, wherein:
a distance d between at least another portion of the edge of the lens projection and the edge of the pixel projection is greater than zero (d>0).

6. The display panel according to claim 5, wherein:
the first lens body and the pixel opening don't overlap with each other in a region where d>0.

7. The display panel according to claim 6, wherein:
the first lens body includes a first body portion and a plurality of first convex portions protruding above the first body portion, wherein a first gap is included between two adjacent first convex portions, a distance between an edge of orthographic projections of the plurality of first convex portions on the substrate and the edge of the pixel projection is zero, and the orthographic projections of the plurality of first convex portions on the substrate don't overlap the pixel projection.

8. The display panel according to claim 7, wherein:
widths of first gaps between adjacent first convex portions are equal, wherein a width is a distance along an arrangement direction of the plurality of first convex portions.

9. The display panel according to claim 5, wherein:
the first lens body and the pixel opening overlap with each other in a region where d>0; wherein:
the first lens body includes a second body portion and a plurality of second convex portions protruding above the second body portion, wherein a second gap is included between two adjacent second convex portions, and orthographic projections of the second gap and the plurality of second convex portions on the substrate are within the pixel projection.

10. The display panel according to claim 9, wherein:
widths of second gaps between adjacent second convex portions are equal, wherein a width is a distance along an arrangement direction of the plurality of second convex portions.

11. The display panel according to claim 1, wherein:
the pixel opening includes a first pixel opening, a second pixel opening, and a third pixel opening, wherein the first pixel opening, the second pixel opening, and the third pixel opening, are respectively provided with a first color light-emitting device, a second color light-emitting device, and a third color light-emitting device;
a wavelength of a first color light is greater than a wavelength of a second color light, and the wavelength of the second color light is greater than a wavelength of a third color light; and a length of second convex portions overlapping the first pixel opening in an extension direction of the second convex portions is L1, a length of the second convex portions overlapping the second pixel opening in the extension direction of the second convex portions is L2, and a length of the second convex portions overlapping the third pixel opening in the extension direction of the second convex portions is L3, wherein L3>L2>L1.

12. The display panel according to claim 5, wherein:
the pixel opening is polygonal, the pixel projection includes at least a long side and a short side, and an extension size of the long side is larger than an extension size of the short side; and
an overlapping size of the edge of the lens projection and an edge of a projection of the long side is less than or equal to an overlapping size of the edge of the lens projection and an edge of a projection of the short side.

13. The display panel according to claim 5, wherein:
a portion of the first lens body and the pixel opening don't overlap with each other in a region where d>0, and another portion of the first lens body and the pixel opening overlap with each other in the region where d>0.

14. The display panel according to claim 13, wherein:
the first lens body includes a third body portion, a third convex portion protruding above the third body portion, and a third groove formed by recessing the third body portion,
wherein, a distance between an edge of an orthographic projection of the third body portion and the edge of the pixel projection is zero, an orthographic projection of the third convex portion is within the pixel projection, and an orthographic projection of the third groove is outside the pixel projection.

15. The display panel according to claim 5, wherein:
in a region with the distance d between the edge of the lens projection and the edge of the pixel opening greater than zero, the distance between the edge of the lens projection and the edge of the pixel projection is proportional to an area of the corresponding pixel projection.

16. The display panel according to claim 15, wherein:
in the region with the distance d between the edge of the lens projection and the edge of the pixel opening greater than zero, a first distance d1 is between the edge of the first pixel projection and the edge of the lens projection, a second distance d2 is between the edge of the second pixel projection and the edge of the lens projection, and a third distance d3 is between the edge of the third pixel projection and the edge of the lens projection; and the area of the first pixel projection is smaller than the area of the second pixel projection, the area of the second pixel projection is smaller than the area of the third pixel projection, the first distance d1 is smaller than the second distance d2, and the second distance d2 is smaller than the third distance d3.

17. The display panel according to claim 1, wherein:
the lens projection and the pixel projection don't overlap with each other at all, the first lens body does not overlap the pixel opening at all in the thickness direction, and a ratio of an edge length of the pixel projection to an area of the pixel projection is greater than or equal to 4.25%.

18. The display panel according to claim 17, wherein:
the pixel projection includes at least a first straight edge, a second straight edge, and a third straight edge that are successively distributed, wherein the second straight edge is connected between the first straight edge and the third straight edge, and an inner angle between the first straight edge and the third straight edge is greater than or equal to 180°; and/or
the pixel projection includes at least an arc-shaped edge, wherein the arc-shaped edge is recessed towards the pixel projection.

19. The display panel of claim 1, further comprising:
a second lens layer on a side of the first lens layer away from the pixel definition layer, wherein the second lens layer includes a second lens body and a lens protrusion protruding above the second lens body, wherein the lens protrusion is located in the lens opening, and a refractive index of the second lens layer is greater than a refractive index of the first lens layer.

20. A display device, comprising:
a display panel, including:
   a substrate;
   a pixel definition layer disposed on a side of the substrate, wherein the pixel definition layer includes an isolation structure and a pixel opening enclosed by the isolation structure; and
   a first lens layer disposed on a side of the pixel definition layer away from the substrate, wherein the first lens layer includes a first lens body and a lens opening enclosed by the first lens body, and in a thickness direction of the display panel, the first lens body at least overlaps the isolation structure, and the lens opening overlaps the pixel opening,
wherein, an orthographic projection of the first lens body on the substrate is a lens projection, an orthographic projection of the pixel opening on the substrate is a pixel projection, and a distance between at least a portion of an edge of the lens projection and an edge of the pixel projection is substantially zero.

* * * * *